US010794371B2

(12) United States Patent
Vancil et al.

(10) Patent No.: US 10,794,371 B2
(45) Date of Patent: Oct. 6, 2020

(54) MICRO-THRUSTER CATHODE ASSEMBLY

(71) Applicant: E BEAM INC., Beaverton, OR (US)

(72) Inventors: Bernard K Vancil, Beaverton, OR (US); Joseph Kowalski, Beaverton, OR (US); Jereme Shaver, Beaverton, OR (US)

(73) Assignee: E BEAM INC., Beaverton, OR (US)

( * ) Notice: Subject to any disclaimer, the term of this patent is extended or adjusted under 35 U.S.C. 154(b) by 0 days.

(21) Appl. No.: 16/572,304

(22) Filed: Sep. 16, 2019

(65) Prior Publication Data

US 2020/0240398 A1 Jul. 30, 2020

(51) Int. Cl.
*F03H 1/00* (2006.01)
*H05H 1/48* (2006.01)

(52) U.S. Cl.
CPC ......... *F03H 1/0012* (2013.01); *F03H 1/0087* (2013.01); *H05H 1/48* (2013.01)

(58) Field of Classification Search
CPC ........ F03H 1/0012; F03H 1/0087; H05H 1/48
See application file for complete search history.

(56) References Cited

U.S. PATENT DOCUMENTS

| | | | | |
|---|---|---|---|---|
| 5,425,231 A * | 6/1995 | Burton | F03H 1/0012 | 60/203.1 |
| 6,373,023 B1 * | 4/2002 | Hoskins | H05H 1/54 | 219/121.52 |
| 9,874,202 B2 * | 1/2018 | Goebel | F03H 1/0012 | |
| 9,897,079 B2 * | 2/2018 | Karadag | F03H 1/0075 | |
| 2002/0116915 A1 * | 8/2002 | Hruby | F03H 1/0087 | 60/202 |
| 2016/0133426 A1 * | 5/2016 | Madocks | H01J 37/08 | 315/111.91 |

* cited by examiner

*Primary Examiner* — Donald L Raleigh
(74) *Attorney, Agent, or Firm* — PATENTTM.US; James Walters

(57) ABSTRACT

Plasma cathodes for micro Hall and ion thrusters of unprecedented power efficiency, low cost, compactness, are provided. The cathodes employ, for example, a very small planar scandate cathode as electron source, delivering over 350 ma of discharge from an emitter area as small as only 0.012 cm2.

20 Claims, 6 Drawing Sheets

10 24 13 15 17 30 14 32 20 28 16 19 e⁻ 17 15 18 22 12 13 26

MICRO-THRUSTER CATHODE ASSEMBLY

STATEMENT REGARDING FEDERALLY SPONSORED RESEARCH OR DEVELOPMENT

This invention was made with government support under contract number 80NSSC18P2166 awarded by NASA. The government may have certain rights in the invention.

CROSS-REFERENCE TO RELATED APPLICATIONS

This application claims benefit of U.S. provisional patent application Ser. No. 62/797,121 filed Jan. 25, 2019.

BACKGROUND

This disclosure relates to ion and Hall thrusters for electric space propulsion use and more particularly to improved cathodes and geometry for micro-thruster use.

There is a great need in satellites, particularly with CubeSats, a type of miniaturized satellite, for efficient low-cost, low-power-consumption thrusters for use for attitude control, north/south positioning, orbit raising/lowering and formation flying.

Typical ion thrusters may use hollow cathodes as electron source, but these cathodes are expensive, are not easily miniaturized and might consume excessive power. CubeSats in particular have a low power availability, for example, less than 4 watts, so such large power amounts exceed sustainable levels.

Microwave and RF plasma schemes also suffer for this application in that they do not efficiently produce electrons.

SUMMARY

In accordance with the disclosure, a plasma cathode for micro Hall and ion thrusters of unprecedented power efficiency, low cost, compactness, and durability is provided.

The subject matter of the present technology is particularly pointed out and distinctly claimed in the concluding portion of this specification. However, both the organization and method of operation, together with further advantages and embodiments thereof, may best be understood by reference to the following description taken in connection with accompanying drawings wherein like reference characters refer to like elements.

DETAILED DESCRIPTION

The system according to a preferred embodiment of the present disclosure comprises plasma cathodes for micro Hall and ion thrusters of unprecedented power efficiency, low cost, compactness, and durability. The cathodes employ, for example, a very small planar scandate cathode as electron source. This revolutionary cathode technology is capable of delivering over 350 ma of discharge from an emitter area as small as only 0.006 cm2. Efficiency in discharge is measured to be >70 ma/watt of input power. This innovation avoids conventional hollow cathode keeper geometries, which are too expensive, use too much power, and are difficult to miniaturize.

Figure 1:
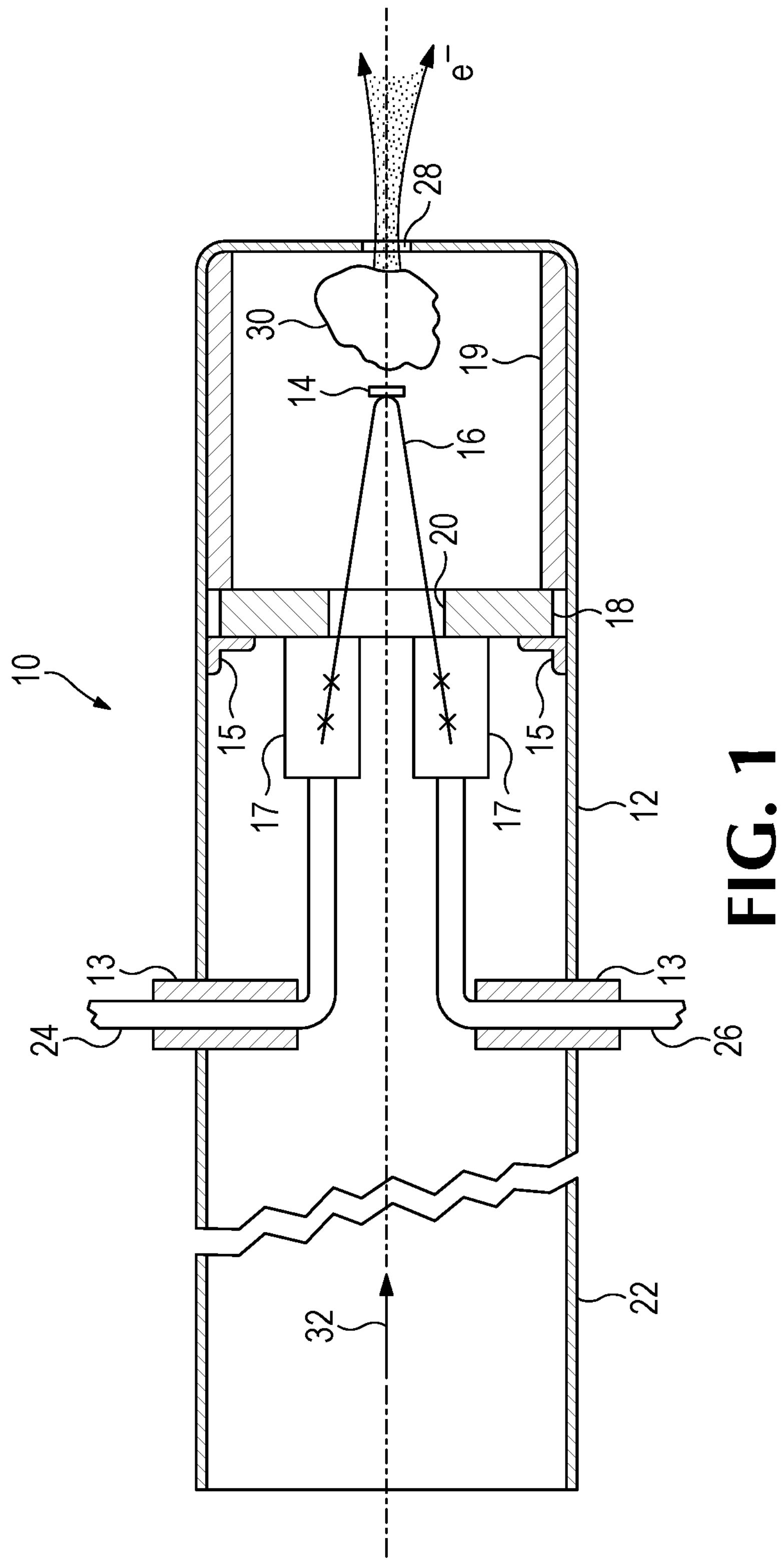
FIG. 1 is a diagram of a micro-thruster cathode assembly in accordance with the disclosure.

Referring now to FIG. 1, a diagram of a micro-thruster cathode assembly 10, mounted in the hollow interior of a vessel 12 is a planar thermionic emitter 14 is attached to a tungsten hairpin heater/support 16, mounted on a ceramic base such as an insulator disk 18. The insulator disk 18 has a orifice 20 formed therethrough that is in communication with inlet tube 22. Heater leads 24, 26 provide power to heat the emitter in operation, via mounts 17. Heater leads are insulated and sealed via insulator tubes 13 and 13' The vessel 12 in the illustrated embodiment is cylindrical, although it can also be non-cylindrical, and may be provided with a spacer 19, which defines cathode setback and a retainer 15 which captures insulator disk 18. An orifice 28 is formed at the end of the vessel. An anode 34 is positioned beyond the orifice.

In operation, emitter 14 is heated by application of power to the heater leads, a propellant gas flow 32 is provided via the inlet tube 22, such as xenon gas, and electrons from the emitter combined with the gas form plasma 30. The anode causes the electrons to flow out of the orifice 28, which then ionize a larger body of gas beyond the orifice.

Figure 2:
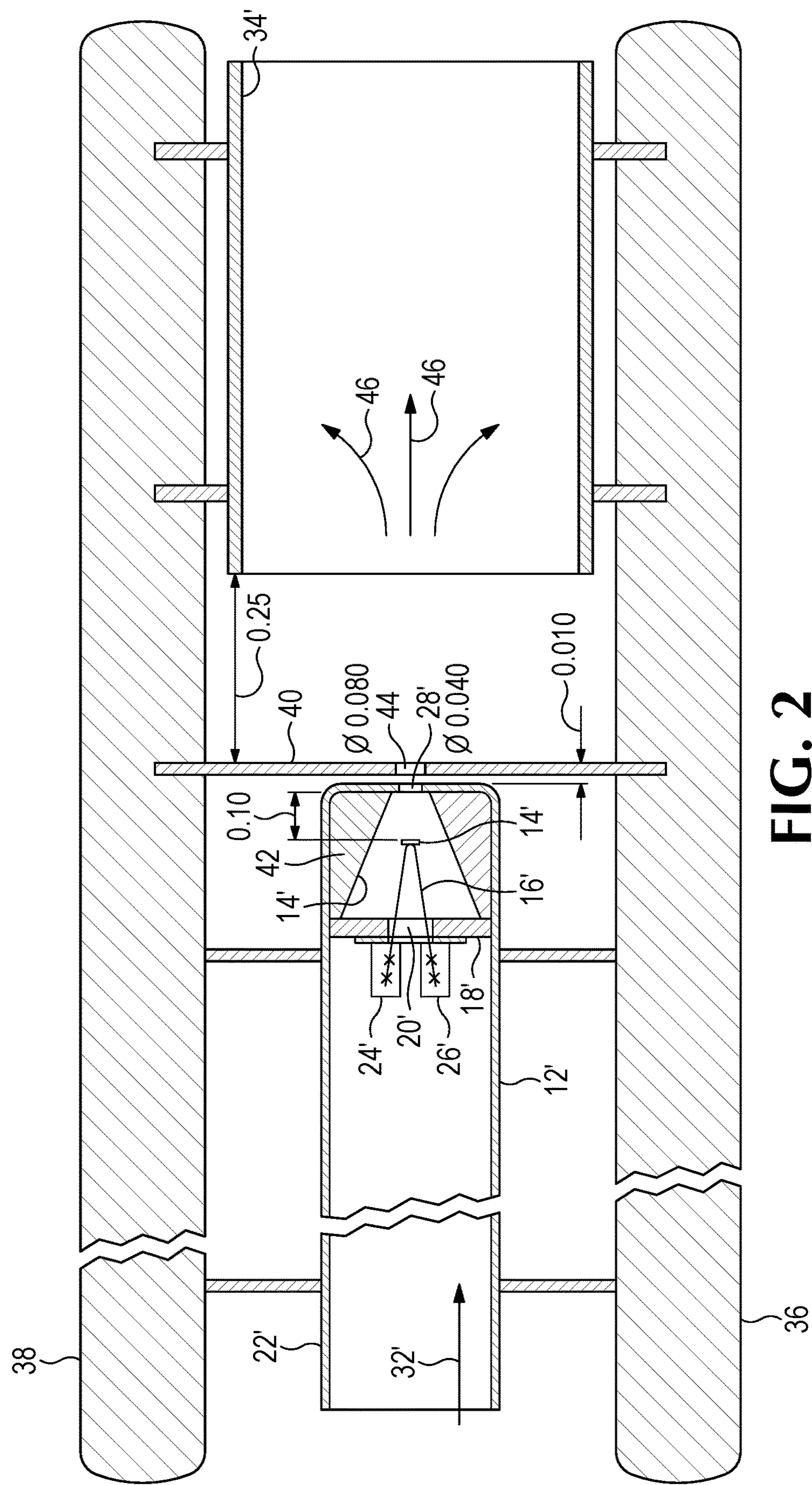
FIG. 2 is a diagram of the micro-thruster cathode assembly in a test configuration, also part of this disclosure.

Referring to FIG. 2, a test configuration is shown with dimensional data. Pyrex glass rods 36, 38 mount and insulate the components. Inlet tube 22' supplies gas flow 32'. Heater lead supports 24', 26' are provided as is insulator disk 18' with orifice 20' for mounting emitter 14' via tungsten hairpin heater/support 16'. The vessel 12' may have 'cup' portion 42 with an optional tapered configuration from before the emitter towards the orifice 28'. Mounted outside the vessel beyond the orifice is a keeper plate 40 which has an orifice 44 aligned to the orifice of the vessel 12', orifice 44 being larger diameter than orifice 28'. The keeper plate, which may suitably be graphite, protects against back-streaming ions and is used to initiate the discharge by imposing momentary higher voltage on it. Subsequent to this it is allowed to float electrically. Positioned further beyond the keeper plate is barrel anode 34'. Electrons 46 from the plasma cathode are captured by the anode. In the illustrated configuration, anode 34' and vessel 12' have a hollow cylindrical shape.

Suitable dimensions of an exemplary tested device are:

| | Distance - inches |
|---|---|
| Distance from emitter to end of vessel 12' | 0.10 |
| diameter of orifice 28' | 0.04 |
| diameter of orifice 44 | 0.08 |
| distance from outer face of vessel 12' to keeper 40 | 0.01 |
| distance from outer face of keeper 40 to anode 34' | 0.25 |

For testing, a static pressure of xenon gas is sometimes provided instead of the xenon flow 32'. The FIG. 2 assembly is installed in a vacuum envelop. A xenon capsule is breached and about one torr of xenon is established inside the vacuum envelope. While in this test version flowing xenon is not present, comparisons with flow data reveal similar discharge curves.

Figure 3:
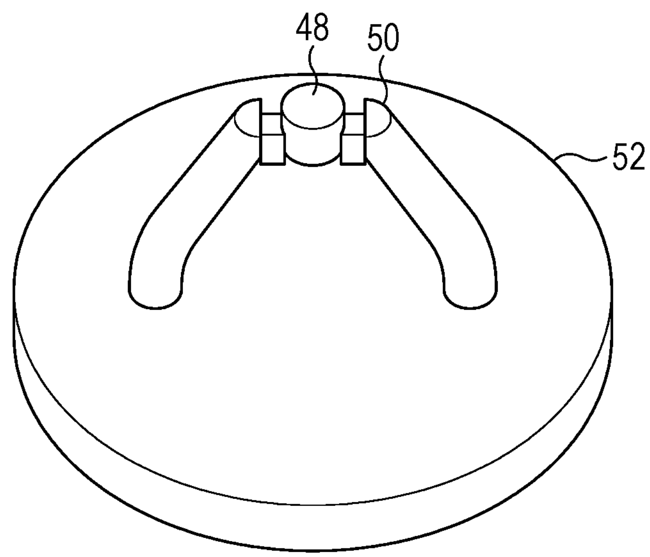
FIG. 3 is a view of a scandate cathode on a mini-vogel mount.
Figure 4:
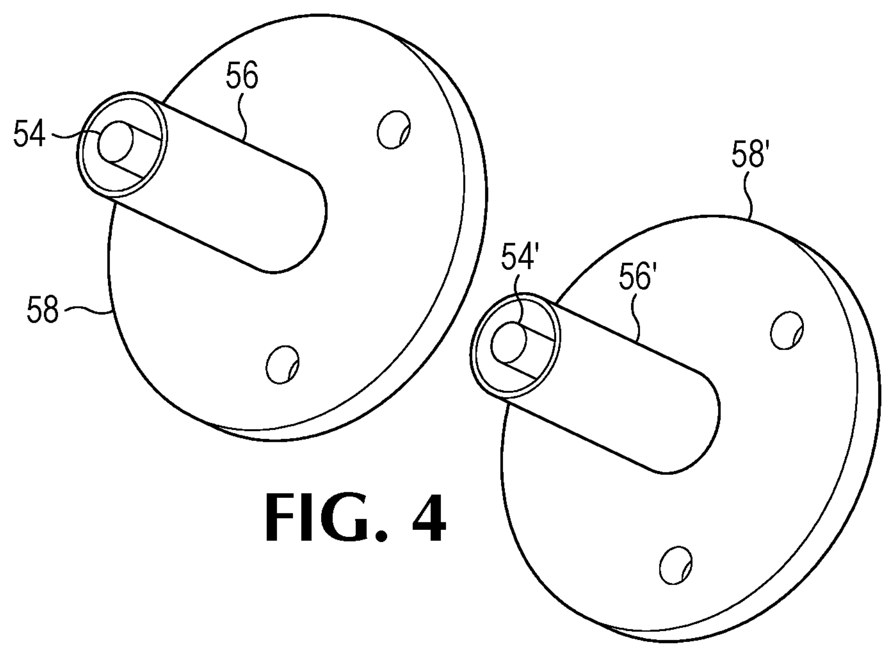
FIG. 4 is a view of scandate cathodes on conventional mounts.
Figure 6:
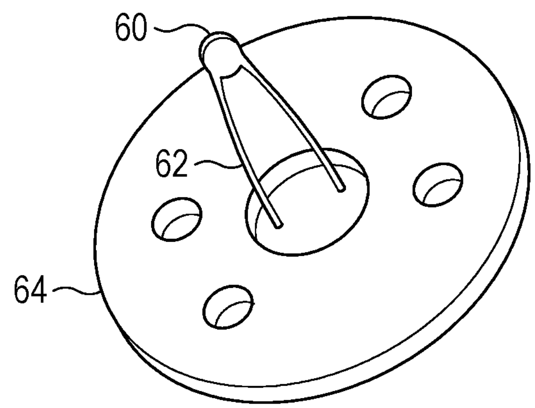
FIG. 6 is a predominantly barium oxide on a nickel disk cathode with tungsten hairpin support and heating element.
Figure 7:
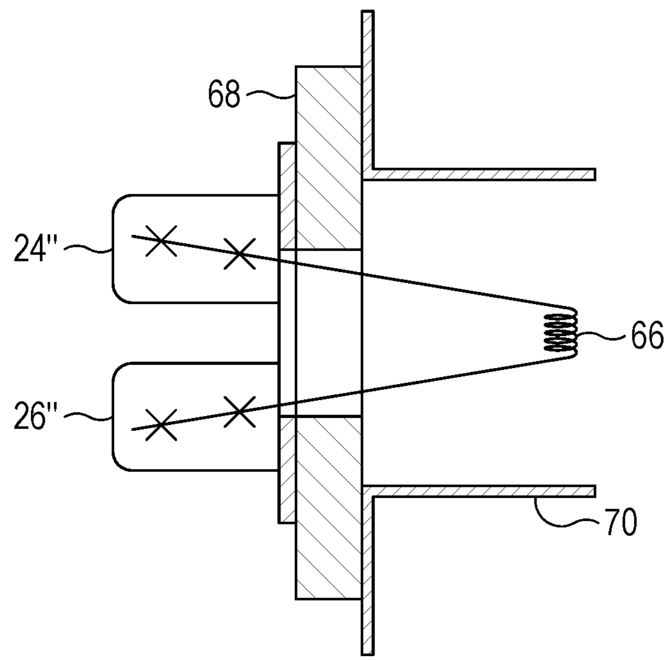
FIG. 7 is a diagram of a tungsten wire with predominantly barium oxide on and between tungsten coils.
Figure 9:
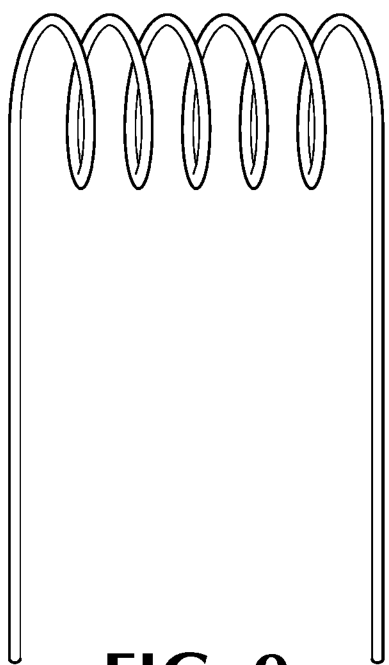
FIG. 9 is a thoriated tungsten wire cathode in accordance with the disclosure.

Types of cathodes tested for use as cathode 14, 14' include:

thoriated tungsten wire cathode (FIG. 9)

scandate cathodes—FIG. 3 and FIG. 4 illustrate a scandate cathode on two mounts primarily barium oxide on a nickel disk with hairpin heater (FIG. 6)

barium oxide on and between tungsten coils on hairpin heater, FIG. 7

$LaB_6$ (lanthanum hexaboride) cathode on a mini-vogel mount (FIG. 8),

HfC (Hafnium Carbide) single-crystal cathode on a mini-vogel mount

Ribbon cathodes (FIG. 10) to include bare tantalum, thoriated tungsten, and tungsten or have coatings such as $ThO_2$ on iridium or tungsten ribbon or $Y_2O_3$ on iridium or tungsten ribbon.

Referring to FIG. 3, a scandate cathode 48 is mounted with mini-vogel mount 50 through insulator disk 52. This particular cathode is 0.05 inch diameter with an area of 0.012 $cm^2$, with less than 2 watts of heater power required to obtain satisfactory operation. FIG. 4 shows a pair of planar scandate cathodes 54, 54' on conventional mounts 56, 56' with insulator disks 58, 58'.

Figure 5:
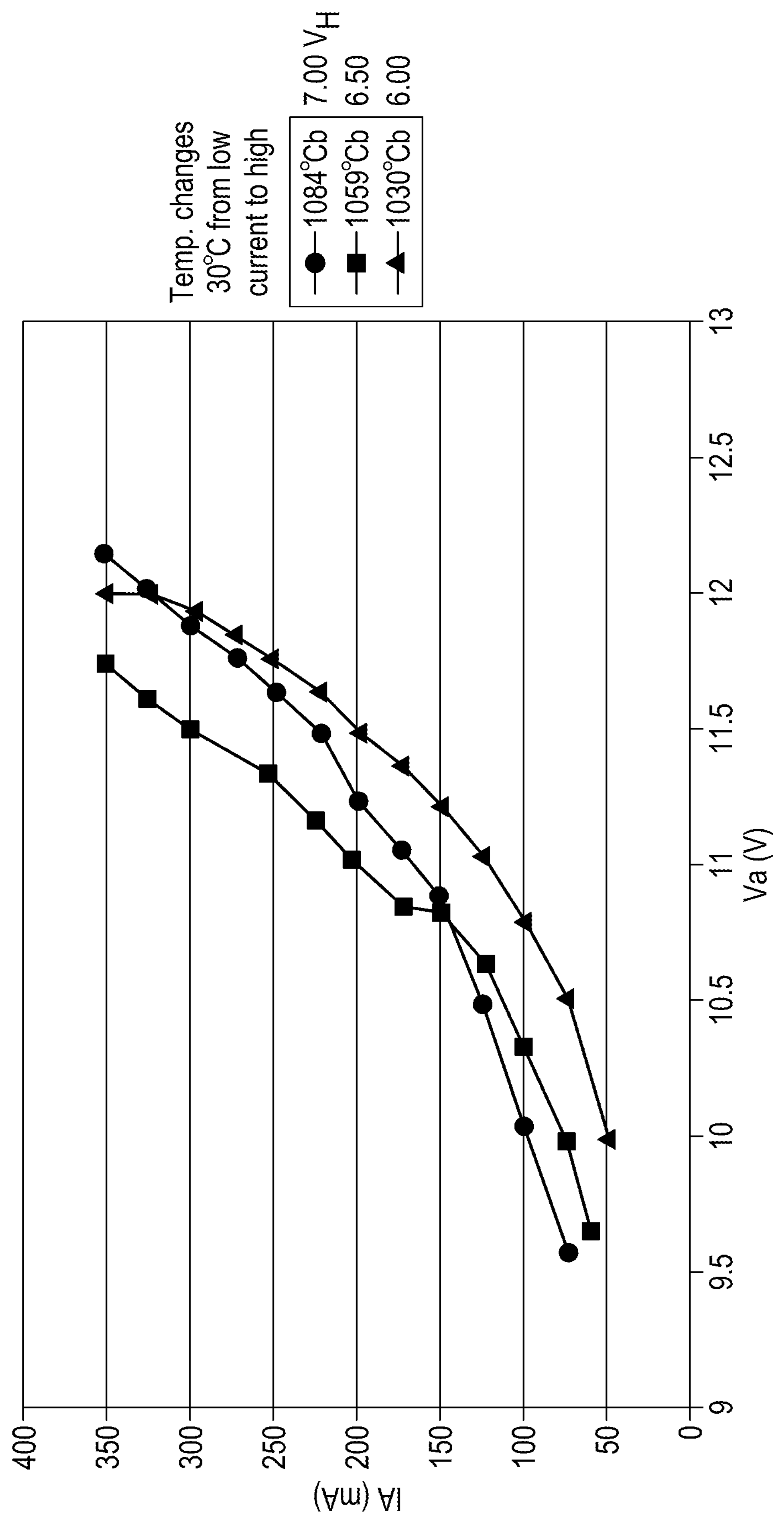
FIG. 5 is a graph illustrating measured emission vs. anode voltage for a planar scandate cathode configuration of the disclosure.

The planar scandate cathode version with the construction of FIG. 2 gives very good performance in that it uses very little power (less than one watt in tested configuration) and has consistent results over long life, making it a currently preferred version. FIG. 5 is a graph illustrating measured emission vs. anode voltage for a planar scandate cathode with an emission area of 0.012 $cm^2$, loaded at 30 $A/cm^2$. The scandate cathode is capable of producing over 100 $A/cm^2$ at under 970° Cb. After 1000 hours CW discharge at 30 A/cm2 no drop in emission or functionality was seen.

Various modes have been tested in the configuration of FIG. 2. For example, the cup portion of the vessel near the orifice may be allowed to float electrically, or may be shorted to the cathode. A typical anode voltage might be 15 volts, and the keeper plate floats. The configuration of the present design, seen in FIG. 2, provides advantage since in a hollow cathode type geometry, the option to make the orifice plate a different potential from the cathode does not exist. Having the ability for different potentials on a vessel gives us another adjustment variable during operation.

Spacer 19 of FIG. 1 can be made of a variety of materials, usually stainless steel. However, it could be a material or have a coating that enhances secondary electron production. These electrons are then drawn down to the anode and form part of the current to the anode. In this way, the cathode loading ($A/cm^2$) is reduced.

FIG. 6 illustrates a cathode in the form of barium oxide on a nickel disk. This version quickly eroded as a result of ion bombardments in absence of ion shielding.

FIG. 7 illustrates the construction of a cathode made with mainly barium oxide (BaO) on and between tungsten coils. This cathode comprises the BaO-coated tungsten coils 66 with insulator disk 68. An ion shield 70 is added to divert most of the ions and prevent them from reaching the cathode, protecting the cathode from ion bombardment. This version is desirable because of low cost. Also, the coils protect the mainly BaO coating from ion erosion.

Figure 8:
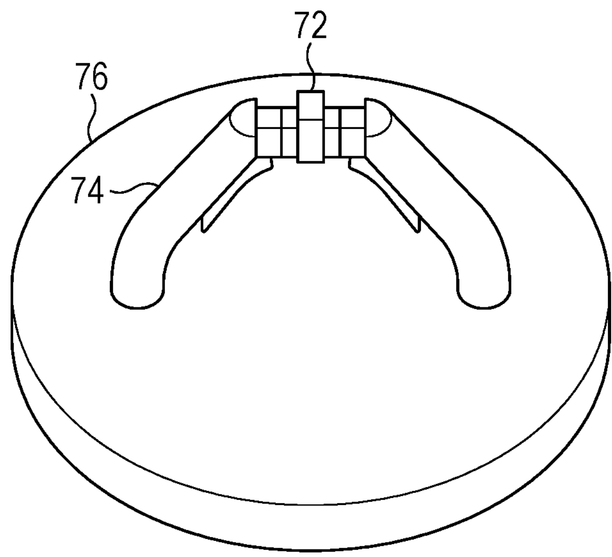
FIG. 8 is a view of a LaB6 cathode on a mini-vogel mount.
Figure 10:
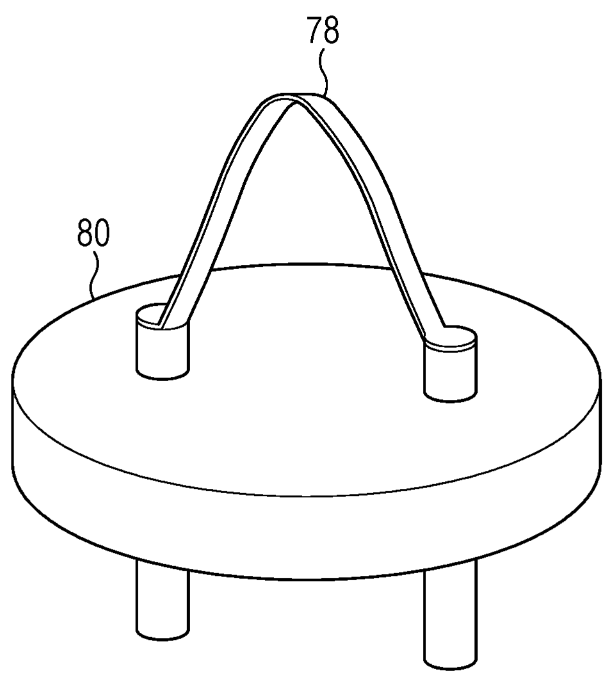
FIG. 10 is a view of a ribbon cathode that may be made of tantalum, tungsten, thoriated, tungsten or iridium and may have coatings of $Y_2O_3$ or $ThO_2$ on any of those ribbon materials.

FIG. 8 is a view of a $LaB_6$ single crystal 72 cathode on a mini-vogel mount 74 with insulator disk 76 visible in background. Both this version, and the HfC cathode were resistant to xenon ion bombardment. Their power dissipation can be high however. FIG. 10 illustrates a tantalum ribbon cathode 78 mounted with insulator disk 80. The FIG. 10 ribbon material can also be iridium, tungsten or thoriated tungsten. The ribbons may also employ emission-enhancing coatings such as $ThO_2$ or $Y_2O_3$.

A thoriated tungsten embodiment (shown in FIG. 9) achieved 1000 hours at a discharge current of 300 mA.

Various changes to the illustrated embodiments can be made, such as vessel, orifice size, and cathode setback. In addition, the diameter, shape, and composition of the vessel in the ionization region is adjustable. For example, the interior might be cone-shaped, as in FIG. 2. It may further be made of various materials, such as molybdenum, graphite, stainless steel, aluminum, etc. The orifice in the cup was adjusted, for example, from 0.025 inch to 0.060 inch and the spacing between cathode and orifice was adjusted and the inner diameter of the vessel was reduced and made into a cone on some tests. Little change in performance was observed.

In addition to ion shielding, configurational changes can be employed to further avoid ion erosion, such as positioning the cathode off-axis or tilting it with respect to tube axis.

The cathodes can all be operated CW without cathode thermal runaway or plasma extinction at an anode voltage of approx. 12 volts, providing strong, sustainable plasma discharges that are easy to start.

In accordance with the disclosure, electric propulsion in small satellites, with attitude control, positioning, orbit raising/lowering, and formation flying can be provided. The cathode configuration is most applicable where power budgets are small, such as in CubeSats. CubeSats for upper atmosphere studies could use this device for raising/lowering the orbit. Constellations of CubeSats for cloud/surface radar imaging could use it for position/attitude control. This thruster could provide precision positioning for synthetic aperture radars employing numbers of CubeSats flying in formation.

While a preferred embodiment of the technology has been shown and described, it will be apparent to those skilled in the art that many changes and modifications may be made without departing from the broader aspects. The appended claims are therefore intended to cover all such changes and modifications as fall within the true spirit and scope of the technology.

What is claimed is:

1. A plasma cathode for micro-thruster, comprising:

a gas inlet;

an insulating support member adapted for passing gas therethrough;

a non-hollow cathode positioned in a discharge chamber in which a plasma is generated, said cathode mounted by said insulating member;

an exit orifice from the discharge chamber spaced away from the cathode;

an anode positioned beyond the exit orifice relative to the cathode for extracting electrons from the cathode; and a keeper plate positioned between the exit orifice and the anode.

2. The plasma cathode for micro-thruster according to claim 1, wherein said cathode comprises a scandate cathode.

3. The plasma cathode for micro-thruster according to claim 1, where said cathode comprises a nickel disk coated with primarily a barium oxide and heated by a tungsten wire.

4. The plasma cathode for micro-thruster according to claim 1, wherein said cathode comprises primarily barium oxide embedded in a tungsten coil.

5. The plasma cathode for micro-thruster according to claim 1 wherein said cathode consists of a coil of a thoriated tungsten wire or ribbon.

6. The plasma cathode for micro-thruster according to claim 1, wherein said cathode comprises a Hafnium Carbide single-crystal cathode.

7. The plasma cathode for micro-thruster according to claim 1, wherein said cathode comprises a lanthanum hexaboride cathode.

8. The plasma cathode for micro-thruster according to claim 1, wherein said cathode comprises e $ThO_2$ coated onto tungsten ribbon.

9. The plasma cathode for micro-thruster according to claim 1, wherein said cathode comprises $ThO_2$ coated onto iridium ribbon.

10. The plasma cathode for micro-thruster according to claim 1, wherein said cathode comprises e $Y_2O_3$ coated onto iridium ribbon.

11. The plasma cathode for micro-thruster according to claim 1, wherein said cathode comprises $Y_2O_3$ coated onto tungsten ribbon.

12. The plasma cathode for micro-thruster according to claim 1, wherein said keeper plate positioned between said exit orifice and said anode is for igniting plasma.

13. The plasma cathode for micro-thruster according to claim 1, wherein said plasma cathode for micro-thruster comprises a cylindrical configuration.

14. The plasma cathode for micro-thruster according to claim 1, comprising a cylindrical cup with orifice with cathode enclosed therein.

15. The plasma cathode for micro-thruster according to claim 1, comprising a cylindrical gas inlet tube attached to a cylindrical cup.

16. The plasma cathode for micro-thruster according to claim 15, comprising plural glass rods for insulating, spacing, and aligning said cylindrical cup, said inlet gas tube, said exit orifice, said keeper plate and said anode.

17. The plasma cathode for micro-thruster according to claim 1, wherein said cathode positioned in the discharge chamber is a planar cathode.

18. The plasma cathode for micro-thruster according to claim 15, wherein said cathode positioned off axis in the cylindrical cup.

19. The plasma cathode for micro-thruster according to claim 16 wherein said planar cathode plane is not parallel to a plane of the orifice in front of it.

20. The plasma cathode for micro-thruster according to claim 15 wherein said cathode is off a centerline of the cylindrical cup.

* * * * *